(12) United States Patent
Hayakawa

(10) Patent No.: US 9,479,756 B2
(45) Date of Patent: Oct. 25, 2016

(54) STEREO CAMERA DEVICE

(71) Applicant: Hitachi Automotive Systems, Ltd., Hitachinaka-shi, Ibaraki (JP)

(72) Inventor: Jun Hayakawa, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 14/783,354

(22) PCT Filed: Mar. 5, 2014

(86) PCT No.: PCT/JP2014/055535
§ 371 (c)(1),
(2) Date: Oct. 8, 2015

(87) PCT Pub. No.: WO2014/167918
PCT Pub. Date: Oct. 16, 2014

(65) Prior Publication Data
US 2016/0057403 A1    Feb. 25, 2016

(30) Foreign Application Priority Data

Apr. 9, 2013  (JP) .................................. 2013-081166

(51) Int. Cl.
| | |
|---|---|
| *H04N 13/02* | (2006.01) |
| *H05K 9/00* | (2006.01) |
| *H04N 5/225* | (2006.01) |
| *H04N 5/357* | (2011.01) |
| *G03B 17/02* | (2006.01) |

(52) U.S. Cl.
CPC ........ *H04N 13/0203* (2013.01); *H04N 5/2252* (2013.01); *H04N 5/357* (2013.01); *H04N 13/0239* (2013.01); *H05K 9/0037* (2013.01); *G03B 17/02* (2013.01); *H04N 2213/001* (2013.01)

(58) Field of Classification Search
None
See application file for complete search history.

(56) References Cited

U.S. PATENT DOCUMENTS

2013/0329017 A1    12/2013  Hayakawa et al.

FOREIGN PATENT DOCUMENTS

| JP | 5-129790 A    | 5/1993 |
|---|---|---|
| JP | 2005-229431 A | 8/2005 |
| JP | 2006-5385 A   | 1/2006 |
| JP | 2006-210742 A | 8/2006 |
| JP | 2012-186574 A | 9/2012 |

OTHER PUBLICATIONS

International Search Report (PCT/ISA/210) issued in PCT Application No. PCT/JP2014/055535 dated Apr. 22, 2014 with English translation (five pages).

*Primary Examiner* — Roberto Velez
*Assistant Examiner* — Stephen Coleman
(74) *Attorney, Agent, or Firm* — Crowell & Moring LLP

(57) ABSTRACT

The present invention prevents adverse effects on an external device due to radiation noise from a signal line. A stereo camera device is provided with: a case; a first image-capturing unit provided at one end in a longitudinal direction of the case; a second image-capturing unit provided at the other end; a circuit board provided inside the case, a processing circuit connected to each of the first image-capturing unit and the second image-capturing unit by a signal line being mounted on the circuit board, and a connector for outputting a signal processed by the processing circuit to an external apparatus being disposed on the circuit board; and a partition member for partitioning the inside of the case into a plurality of spaces along the longitudinal direction at a first interval that corresponds to a frequency bandwidth in which radiation noise from the signal line is suppressed.

4 Claims, 7 Drawing Sheets

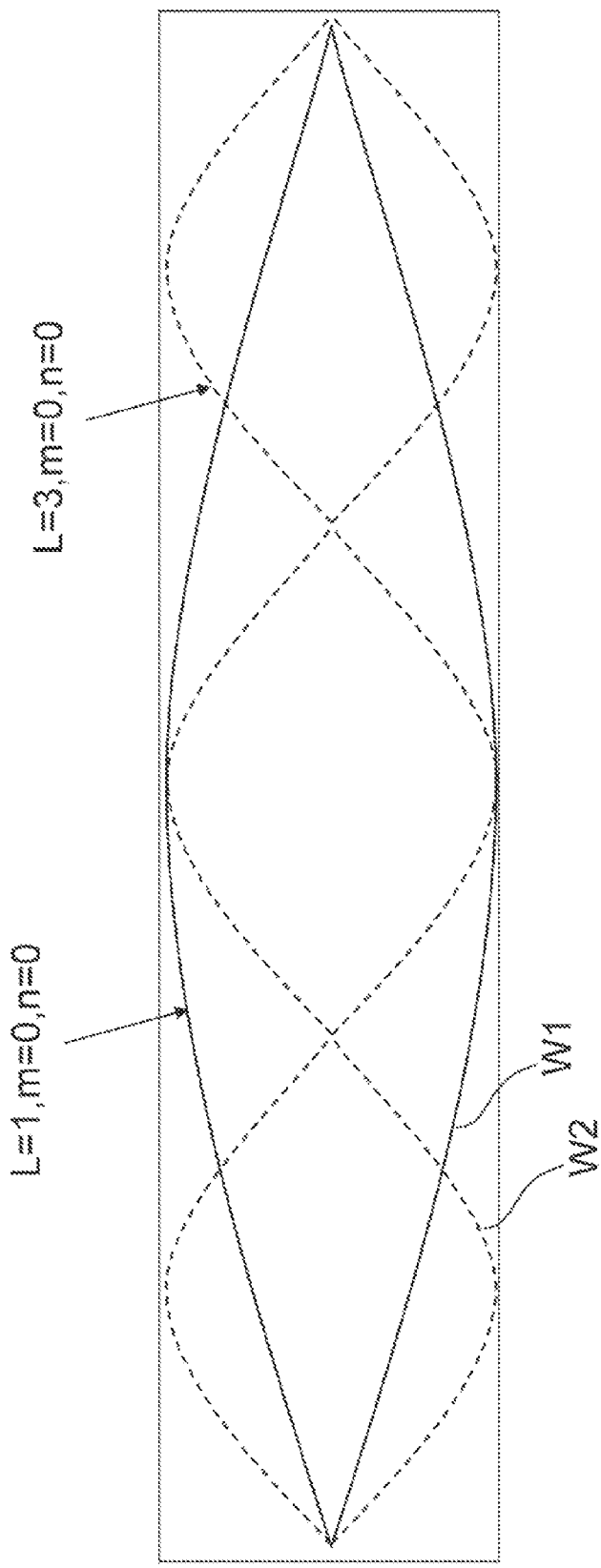

STEREO CAMERA DEVICE

TECHNICAL FIELD

The present invention relates to a stereo camera device.

BACKGROUND ART

Conventionally, there is known a camera module having such a structure that a partition plate is provided between an imaging element and an image-processing substrate, and noise generated in the substrate is not transmitted to the imaging element (e.g., PTL 1).

CITATION LIST

Patent Literature

PTL 1: JP 2005-229431 A

SUMMARY OF INVENTION

Technical Problem

However, in the case of a stereo camera in which an imaging element and an image-processing IC are connected to each other through a long signal line, there is a problem that many radiation noises are generate from the signal line due to cavity resonance.

Solution to Problem

A stereo camera device described in claim 1, including: a casing, a first imaging portion provided on one of ends of the casing in a longitudinal direction of the stereo camera device, a second imaging portion provided on the other end of the casing in the longitudinal direction, a substrate on which a processing circuit connected to the first imaging portion and the second imaging portion through signal lines is mounted, on which a connector for outputting a signal processed by the processing unit to an external device is placed, and which is provided, in the casing, and at least one partition for dividing an interior of the casing into a plurality of spaces in the longitudinal direction at first intervals corresponding to a frequency band which suppresses radiation noise from the signal lines.

Advantageous Effect of Invention

According to the present invention, since a partition is provided, to divide the interior of the casing at the first intervals which correspond to frequency of the radiation noise from the signal line, it is possible to prevent an adverse influence from being exerted on an external device caused by the radiation noise.

BRIEF DESCRIPTION OF DRAWINGS

FIG. 4 is a diagram for describing cavity resonance in a space divided in the casing.

DESCRIPTION OF EMBODIMENTS

First Embodiment

Figure 1:
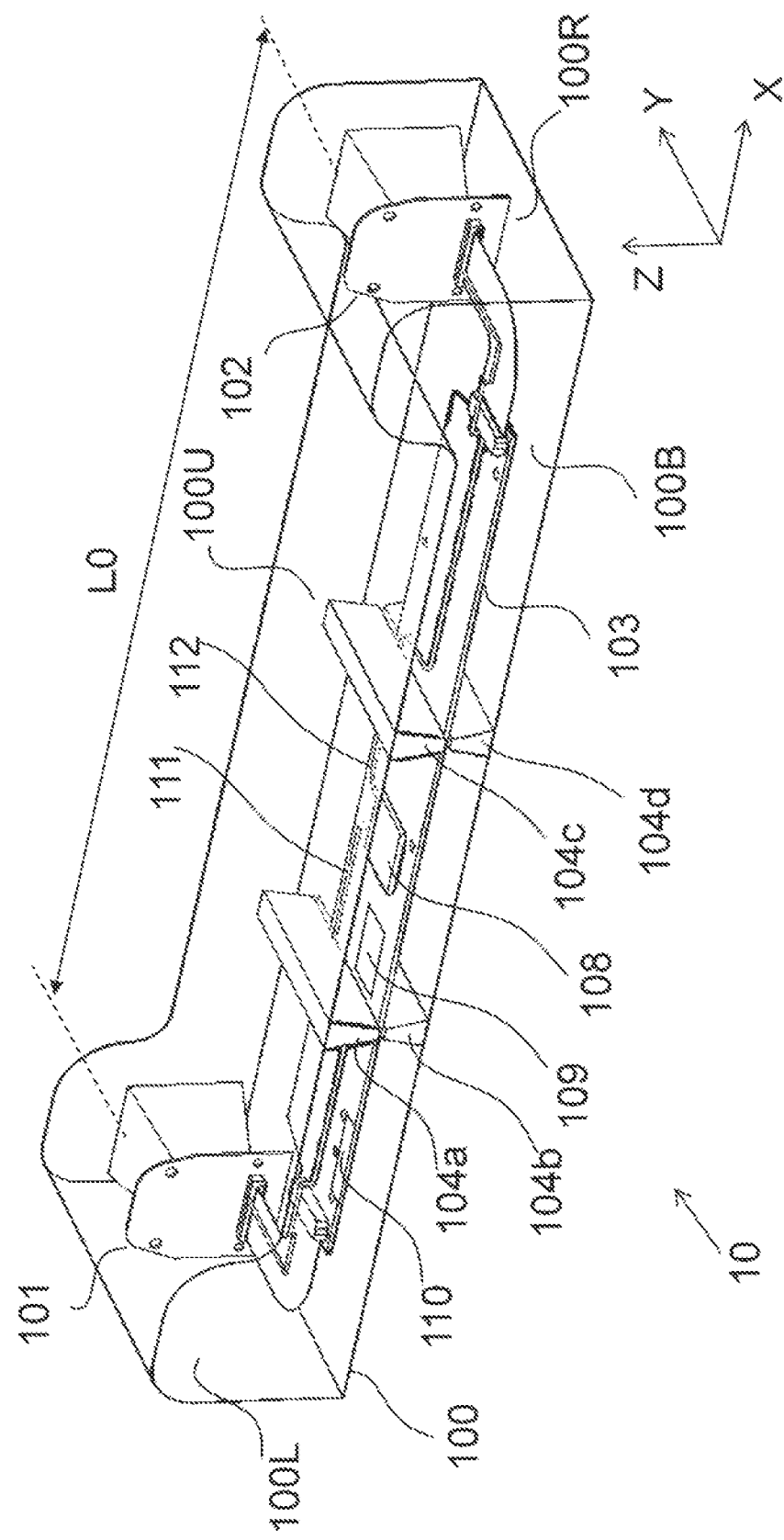
FIG. 1 is a perspective view for describing an interior structure of a stereo camera device according to a first embodiment of the present invention.

A first embodiment of a stereo camera device according to the present invention will be described with reference to the drawings. In this description, the stereo camera device which is provided in a vehicle such as a passenger vehicle and which is an externality recognizing sensor used as one of in-vehicle safety devices is described as one example. The stereo camera device measures a distance to an object utilizing a principle of triangulation using images acquired by two imaging portions provided such that the imaging portions are laterally separated from each other by a reference length (e.g., about 200 mm to 400 mm). FIG. 1 is a transmissive schematic perspective view of an interior structure of the stereo camera device according to the first embodiment. The present invention will be described below based on the assumption that a coordinate system composed of an x axis, a y axis and a z axis is set as shown in the drawings.

The stereo camera device 10 includes a metal casing 100, a first imaging portion 101, a second imaging portion 102, a substrate 103, partition plates 104a, 104b, 104c and 104d (when they are collectively called, reference sign 104 is assigned), an image processing IC 108, a microcomputer 109, a connector 110 and signal lines 111 and 112. The casing 100 has such a cylindrical shape that its long side (longitudinal direction) extends in an x-axis direction. While a cross section shape of the casing 100 at a plane intersecting with the x axis at right angles is rectangular in the example shown in FIG. 1, the cross section shape is determined in associated with an installation place of the stereo camera device 10, and a circular cross section shape or an elliptic cross section shape are also included in one embodiment of the present invention.

The first imaging portion 101 is formed by mounting an imaging element and an optical lens (both not shown), and the first imaging portion 101 is placed on one of ends (−side of x-axis in FIG. 1) of the casing 100. The second imaging portion 102 is formed by mounting an imaging element and an optical lens (both not shown), and the first imaging portion 101 is placed on the other end (+side of x-axis in FIG. 1) of the casing 100. That is, the first imaging portion 101 and the second imaging portion 102 are placed in the casing 100 such that the imaging portions 101 and 102 are separated from each other by a reference length L0 along the x axis which is the longitudinal direction. The first imaging portion 101 and the second imaging portion 102 shoot (take a picture of) a photogenic subject on the y-axis +side, and output, to a later-described image processing IC 1.08, an analogue image signal produced by photoelectric conversion. The first imaging portion 101 and the second imaging portion 102 configuring the stereo camera device 10 are controlled such that image control and sending and receiving operations of signals are carried out substantially at the same time.

The substrate 103 extends in the x-axis direction, i.e., the longitudinal direction of the casing 100, and the substrate 103 is placed in the casing 100 by sandwiching the substrate 103 from the +side of z-axis by the partition plates 104a and 104c and from the −side of z-axis by the partition plates 104b and 104d. A −side end of x-axis and a +side end of x-axis of the substrate 103 are connected to each other through the first imaging portion 101 and the second imaging portion 102, a cable or a connector. The image processing IC 108, the microcomputer 109, the connector 110, the signal lines 111 and 112 and various IC (not shown) are provided on the substrate 103. A circuit GND pattern (wire) or a frame GND pattern (wire) are provided in the y-axis direction at a position where the pattern is connected to the later-described partition plate 104.

The image processing IC 108 is connected to the first imaging portion 101 through the signal line 111 and connected to the second imaging portion 102 through the signal line 112. The image processing IC 108 sends and receives various control signals and analog image signals between the first imaging portion 101 and the second imaging portion 102, converts the received image signal into a digital signal, and calculates a distance to the shot object and a size of the object. The microcomputer 109 is a control circuit which controls the image processing IC 108. The connector 110 supplies power source to various ICs provided on the substrate 103, and outputs a shot image and the like processed by the image processing IC 108 to an in-vehicle external device such as a car radio and a navigation system. The signal lines 111 and 112 are places using ends on the substrate 103 as paths such that the signal lines 111 and 112 can avoid the various ICs and wires provided on the substrate 103. While FIG. 1 shows the example that the image processing IC 108 and the microcomputer 109 are placed in the vicinity of a central portion of the substrate 103, the places where the image processing IC 108 and the microcomputer 109 are placed are not limited to the example shown in FIG. 1.

The partition plates 104 are metal plate members provided to prevent, radiation noise from the signal lines 111 and 112 from being transmitted to the external device through the connector 110 and from exerting adverse influence. The partition plates 104a and 104c are mounted on an upper surface 100U of the casing 100 through a screw or weld. The partition plates 104b and 104d are mounted on a bottom surface 100B of the casing 100 through a screw or weld. A cross section of each of the partition plates 104 at a plane which is parallel to a yz-plane is formed into a rectangular shape such that an interior of the casing 100 is divided into a plurality of spaces in the x-axis direction. A length L of each of the plurality of spaces divided by the partition plates 104 in the x-axis direction, i.e., an interval between the partition prates 104a and 104c, an interval between the partition plates 104b and 104d, an interval between the side surface 100L of the casing 100 and the partition plates 104a and 104b, and an interval between a side surface 100R of the casing 100 and the partition plates 104c and 104d are determined in accordance with a frequency band which suppresses radiation noise from the signal lines 111 and 112. Details of the length L will be described later. Thicknesses of the partition plates 104 are determined such that strength against vibration is secured. The partition plates 104 may integrally be formed together with the casing 100.

Figure 2A:
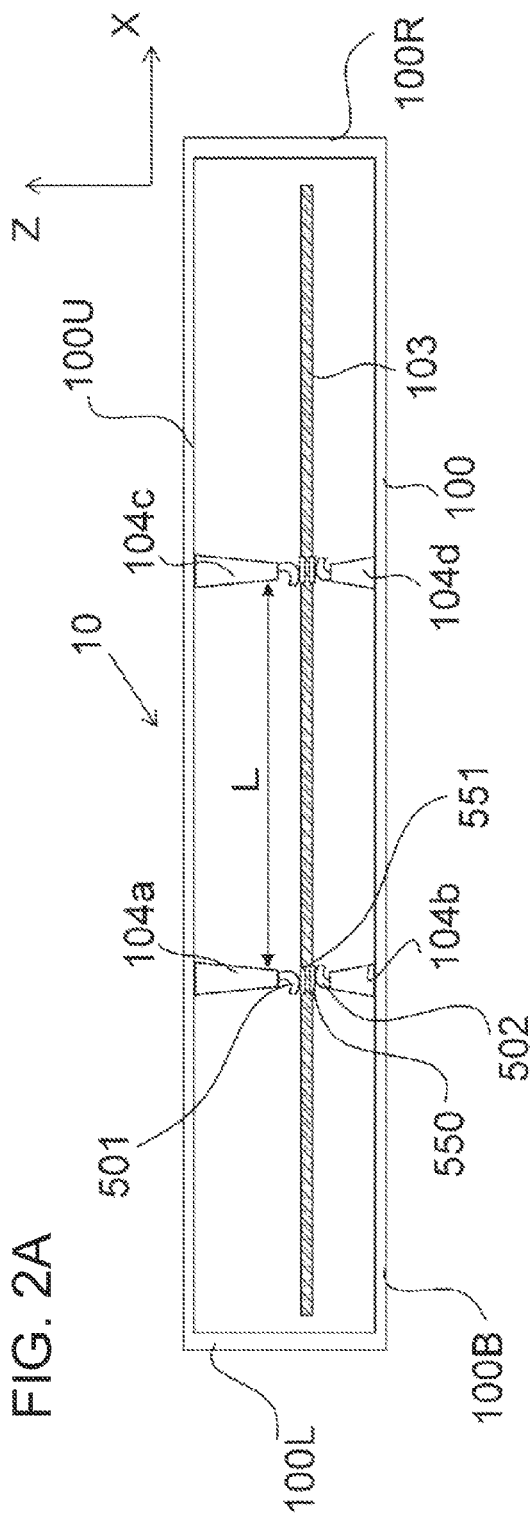
FIGS. 2A and 2B are sectional views of the stereo camera device of the first embodiment.
Figure 2B:
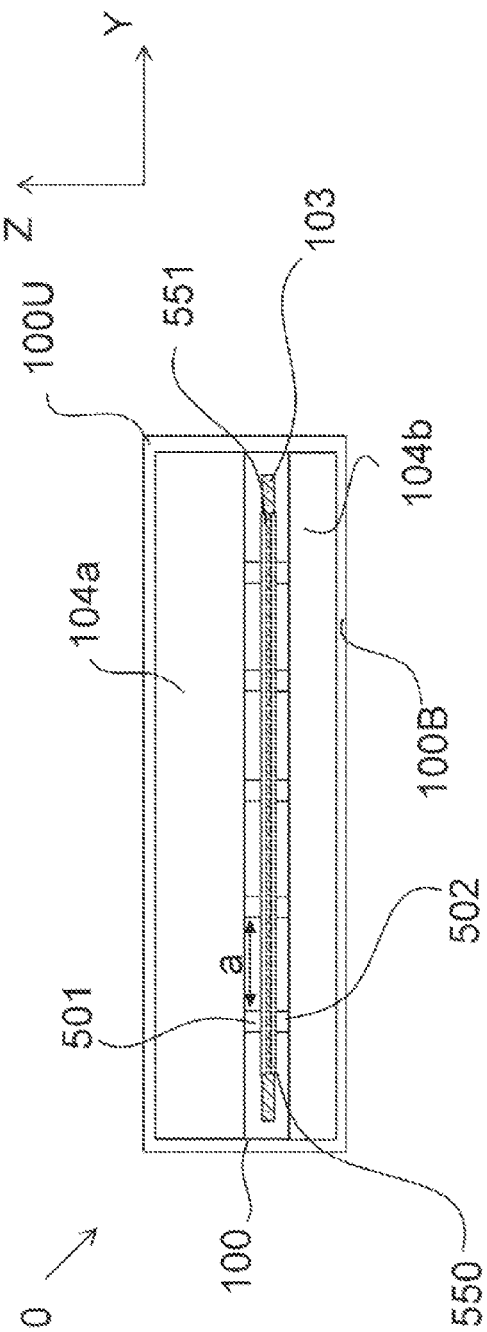

Connection between the substrate 103 and the partition plates 104 will, be described using a sectional view of the casing 100 shown in FIG. 2. FIG. 2(a) is a sectional view of the casing 100 in an xz-plane, and FIG. 2(b) is a sectional view of the casing 100 in a yz-plane. While the following description is made centering on the partition plates 104a and 104b, the partition plates 104c and 104d also have, the same configurations.

As shown in FIG. 2(a), the partition plate 104a is connected to a circuit GND pattern or a frame GND pattern (collectively called ground pattern, hereinafter) 550 provided on an upper surface of the substrate 103 through the ground member 501 made of resilient material, such as a spring. A partition plate 104b is connected to a ground pattern 551 provided on a lower surface of the substrate 103 through the ground member 502 made of radiation noise such as a spring. In this embodiment, the partition plates 104a and 104b and the ground members 501 and 502 are integrally formed respectively.

As shown in FIG. 2(b), the plurality of ground members 501 and 502 are provided at predetermined intervals a in a y-axis direction, i.e., a short direction of the casing 100. That is, the partition plates 104a and 104b are connected to the substrate 103 in a separated manner at the predetermined intervals a in the y-axis direction. Hence, spaces exist between the substrate 103 and the partition plates 104a and 104b By setting the predetermined interval a as will be described later, the space between the substrate 103 and the partition plate 104 function as a waveguide, and the waveguide prevents radiation noise of predetermined frequency or less generated from the signal lines 111 and 112 from being transmitted to the external device through the connector 110 and from exerting adverse influence.

As shown in FIG. 2(a) and FIG. 2(b), the ground member 501 of the partition plate 104a and the ground member 502 of the partition plate 104b are provided substantially on the same straight line in the z-axis direction. Hence, it is possible to enhance a hidden degree of the spaces divided by the partition plates 104a and 104b in the x-axis direction. Further, the substrate 103 sandwiched between the partition plates 104a and 104b is sandwiched from the +side and −side of z-axis substantially by the same forces through the ground members 501 and 502 made of resilient material, and it is possible to prevent the substrate 103 from bending.

Figure 3:
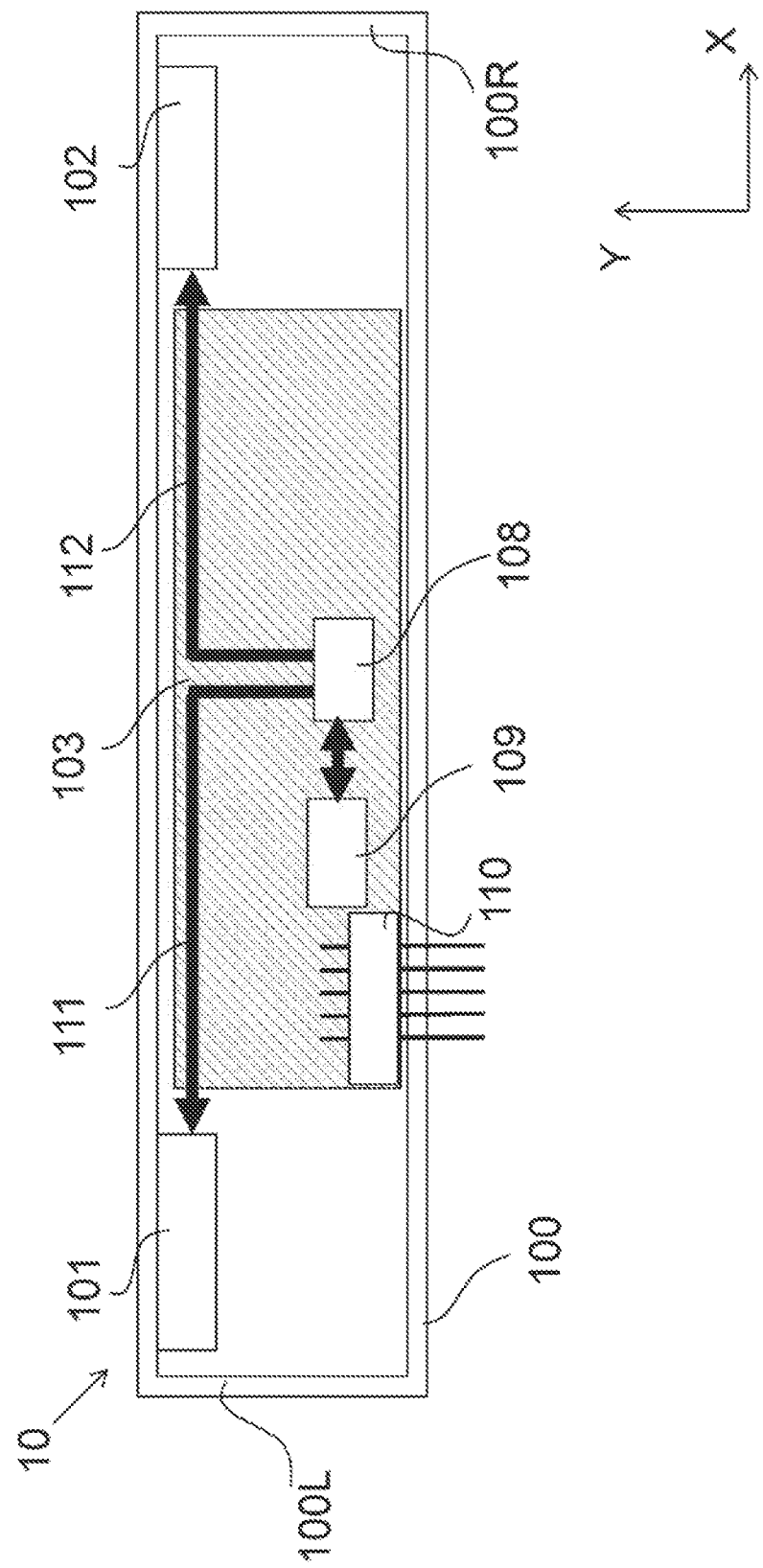
FIG. 3 is a schematic plan view of an upper surface of a substrate provided in a casing.

Radiation noise from the signal lines 111 and 112 will be described below. FIG. 3 is a schematic plan view of the upper surface of the substrate 103 when the interior of the casing 100 is viewed from the +direction of z-axis. As described above, the signal lines 111 and 112 are provided as paths using ends on the substrate 103 such that the signal lines 111 and 112 avoid she various ICs and the wires provided on the substrate 103. Generally, since the ends of the substrate 103 do not easily take return pass of the GND pattern, noise is prone to be radiated from the signal lines 111 and 112.

The signal lines 111 and 112 connect, to each other, the image processing IC 108 provided in the vicinity of a central portion of the upper surface of the substrate 103 and the first imaging portion 101 on the +side of the x-axis and the second imaging portion 102 on the −side of x-axis. Hence, as shown in FIG. 3, wiring paths of the signal lines 111 and 112 have shapes of dipole antenna as described above. To make the first imaging portion 101 and the second imaging portion 102 operate in synchronization with each other, signals are transmitted to the signal lines 111 and 112 substantially at the same time. As a result, the signal lines 111 and 112 function as dipole antenna, and noise is prone to be generated.

Noises generated by the signal lines 111 and 112 occur resonance phenomenon in the space of the cylindrical, casing 100 having the long side in the x-axis direction, and become noises (radiation noises) having high frequency (resonance frequency). When this radiation noise is transmitted to the connector 110 and is discharged to the outside of the stereo camera device 10 or the radiation noise leaks to outside from a gap of the casing 100, the radiation noise exerts adverse influence on the operation of the in-vehicle external device depending upon frequency of the radiation noise.

In this embodiment, by dividing the space in the casing 100 using the partition plates 104, the frequency of the radiation noise is brought into cavity resonance frequency f1 of a frequency band which is higher than a frequency band having the possibility of adverse influence exerted on the operation of the external device, and influence on the operation of the external device, is lowered. In other words, the length L of the space divided in the casing 100 in the x-axis direction is determined such that frequency becomes the cavity resonance frequency f1 which does no exert adverse influence on the operation of the external device.

The cavity resonance frequency f1 is indicated by the following equation (1).

$$f1 = 1.50\{(1/L)^2 + (m/M)^2 + (n/N)^2\}^{1/2} \text{ [MHz]} \quad (1)$$

wherein L, M and N are lengths of the divided spaces in the x axis, the y axis and the z axis. Further, l, m and n shows the number of half wavelengths in the spaces divided in the casing 100.

Since, the casing 100 is of the structure having the long side extending along the x-axis, the length in the x-axis direction is predominant. Hence, the cavity resonance frequency f1 can be expressed by the following equation (2) which is similar to the equation (1). As shown in equation (2), the smaller the length L of the divided space becomes, the higher the cavity resonance frequency f1 becomes.

$$f1 \approx 150 \times (1/L) \text{ [MHz]} \quad (2)$$

A waveform W1 shown by a solid line in FIG. 4 shows one half wavelength forming one node in the space. In this case, l=1, m=0 and n=0. Waveforms W2 shown by a broken line show three half wavelengths forming three nodes in the space. In this case, l=3, m=0 and n=0. As shown in FIG. 2, the greater the number of half wavelengths increases, the higher the cavity resonance frequency f1 becomes. That is, the greater the number of half wavelength, becomes, the higher the cavity resonance frequency f1 becomes. The number of half wavelengths is determined in accordance with a vehicle installation when the stereo camera device 10 is installed. The following description is based on such an example that when the cavity resonance frequency f1 is set to a high frequency band, the number of half wavelength having the severest condition is set to one, i.e., l=1.

As a frequency band having the possibility of adverse influence exerted on the operation of the external device is taken into consideration, the cavity resonance frequency f1 of radiation noise is set to not less than certain frequency (e.g., about 3 [GHz]) which is higher than the highest frequency of a noise spec of each of the external devices. In this case, by inversely calculating equation (2) while setting l to one, the length L of the divided space in the x-axis direction is set to 5 [cm] or less. That is the partition plates 104a, 104b, 104c and 104d are provided in the casing 100 such that the interval between the partition plates 104a and 104c in the x-axis, the interval between the partition plates 104b and 104d in the x-axis, the interval between the side surface 100L of the casing 100 and the partition plates 104a and 104b in the x-axis direction, and the interval between a side surface 100R of the casing 100 and the partition plates 104c and 104d in the x-axis direction shown in FIG. 2 become 5 [cm] or less. However, it is preferable that the lower limit of the interval in the x-axis be determined while taking into consideration, costs of the partition plates 104, installation of the various ICs and parts on the substrate 103 and difficulties of pattern design.

By determining the length L of the space as described above, the cavity resonance frequency f1 becomes a frequency band higher than a frequency band which exerts adverse influence on the external device. Hence, even if radiation noise which becomes the cavity resonance frequency f1 is discharged outside of the stereo camera device 10 through the connector 110 or the radiation noise leaks to outside from the gap of the casing 100, adverse influence is not exerted on the operation of the external device.

The above description is based on the example that the interior of the casing 100 is divided into the three spaces by the partition plates 104. However, the number of divided spaces, i.e., the number of the partition plates 104 provided in the casing 100 differs depending upon radiation noises from the signal lines 111 and 112 and the length of the casing 100 in the x-axis direction.

The partition plates 104 are connected to the substrate 103 at the predetermined interval a in the y-axis such that the partition plates are separated from the substrate 103 as described above. According to this, the spaces existing between the partition plates 104 and the substrate 103 in the z-axis direction function as waveguides. In this case, frequency f2 of radiation noise which is cut off by the spaces existing between the partition plates 104 and the substrate 103 (cutoff frequency f2, hereinafter) is shown by the following equation (3).

$$f2 = c/2a \quad (3)$$

wherein c is speed of light.

The cutoff frequency f2 is a frequency band having nothing to do with the operation of the stereo camera device 10. The cutoff frequency f2 is set to a frequency component which does not reach the cavity resonance frequency f1 by the partition plates 101 and especially, the cutoff frequency f2 is set to a frequency band having the possibility of adverse influence exerted on the external device. That is, it is preferable that the cutoff frequency f2 be set to a value smaller than the cavity resonance frequency f1.

The predetermined interval a is determined based on the equation (3) so that such cutoff frequency f2 is obtained. That is, the predetermined interval a is determined such that radiation noise from the signal lines 111 and 112 which is equal to or less than the cutoff frequency f2 is cut off, and the radiation noise which is equal to or less than the cutoff frequency f2 is prevented from passing from the spaces. As a result, radiation noise from the signal lines 111 and 112 includes a frequency band exerting adverse influence on the external device is cut off. This configuration prevents radiation noise from the signal lines 111 and 112 from being transmitted to the external device through the connector 110 and from exerting di.

The example shown in FIG. 2(b) shows a case where five ground members 501 and 502 are provided respectively. However, the number of ground members 501 and 502 is determined in associated with the predetermined interval a, and it is preferable that at least one pair of ground members 501 and 502 be provided respectively.

According to the stereo camera device of the first embodiment, the following function effects are obtained.

(1) The stereo camera device includes the partition plates 104 dividing the interior of the cylindrical casing 100 into the plurality of spaces in the longitudinal direction at an interval corresponding to a frequency band suppressing radiation noise from the signal lines 111 and 112 which connect, to each other, the first imaging portion 101, the second imaging portion 102 provided on both ends in the longitudinal direction and the image processing IC 108. This interval is determined such that the cavity resonance frequency f1 of a frequency band becomes higher than a frequency band of noise radiated from the signal lines 111 and 112. As a result, even if radiation noise is transmitted to the connector 110 or the radiation noise is discharged outside of the stereo camera device 10 through a harness of the radiation noise leaks to outside from the gap of the casing 100, it is possible to prevent the radiation noise from exerting adverse influence on the operation of the in-vehicle external device. Generally, as frequency of electromagnetic wave is higher, the electromagnetic wave is more prone to be attenuated. Therefore, it is possible to contribute to attenuation of radiation noise by bringing the cavity resonance frequency f1 into a high frequency band. Further, as compared with a countermeasure example in which radio wave absorbent sheets are pasted on the casing 100 and the image processing IC 108 or a gasket is provided in the gap of the casing 100, since it is possible to prevent influence of radiation noise from exerting from exerting on the external device with a simple structure, this configuration also contributes to reduction of costs.

(2) The partition plates 104a and 104c provided on an inner wall of the upper surface 100U of the casing 100 are connected to each other through the ground pattern 550 and the ground member 501 provided on the upper surface of the substrate 103, and the partition plates 104b and 104d provided on an inner wall of the bottom surface 100B of the casing 100 are connected to each other through the ground pattern 551 and the ground member 502 provided on the lower surface of the substrate 103. Hence, since the casing 100 and the circuit GND pattern or the frame GND pattern of the substrate 103 can be connected to each other, it is possible to lower the impedance of GND, and to obtain a noise reduction effect on the substrate 103.

(3) The partition plates 104a and 104c are connected to each other through the ground pattern 550 on the upper surface of the substrate 103 and the ground member 501 made of resilient material, and the partition plates 104b and 104d are connected to each other through the ground pattern 551 on the lower surface of the substrate 103 and the ground member 502 made of resilient material. Hence, since substantially the same forces are applied to the substrate 103 from the +side and −side of z-axis, it is possible to prevent inconvenience that the substrate 103 bends.

(4) Each of the lengths L, in the x-axis direction, of the spaces divided by the partition plates 104 is set as a distance which cavity-resonates noise generated by the signal lines 111 and 112, and which brings the frequency of the noise into a frequency band higher than a noise frequency band that is prescribed by the external device. As a result, since the resonance frequency f1 of radiation noise becomes higher than a frequency band which exerts adverse influence on the external device, even if the radiation noise is discharged outside of the stereo camera device 10 through the connector 110 or the radiation noise leaks to outside from the gap of the casing 100, adverse influence is not exerted on the operation of the in-vehicle external device.

(5) The ground members 501 and 502 are connected to each other along the y-axis at predetermined interval a which correspond to radiation noise from the signal lines 111 and 112. In this case, the predetermined interval a is set such that radiation noise having the cutoff frequency f2 which is smaller than the cavity resonance frequency f1 can be cut off. As a result, it is possible to prevent radiation noise having frequency which is equal to or less than the cutoff frequency f2 having the possibility that adverse influence is exerted on the external device from passing through the space existing in the z-axis direction between the partition plates 104 and the substrate 103. Therefore, it is possible to prevent the radiation noise from the signal lines 111 and 112 from being transmitted to the external device through the connector 110 and from exerting adverse influence on the external device.

Second Embodiment

A second embodiment of the stereo camera device according to the present invention will be described with reference to drawings. In the following description, the same reference signs are allocated to the same constituent element as those of the first embodiment, and differences will mainly be described. Points which are not especially described are the same as the first embodiment. In the first embodiment, the ground member which is integrally formed together with the partition plate, and the partition plate and the substrate are connected to each other. The second embodiment is different from the first embodiment in that a ground member and a partition on plate soldered to a substrate are connected to each other.

Figure 5A:
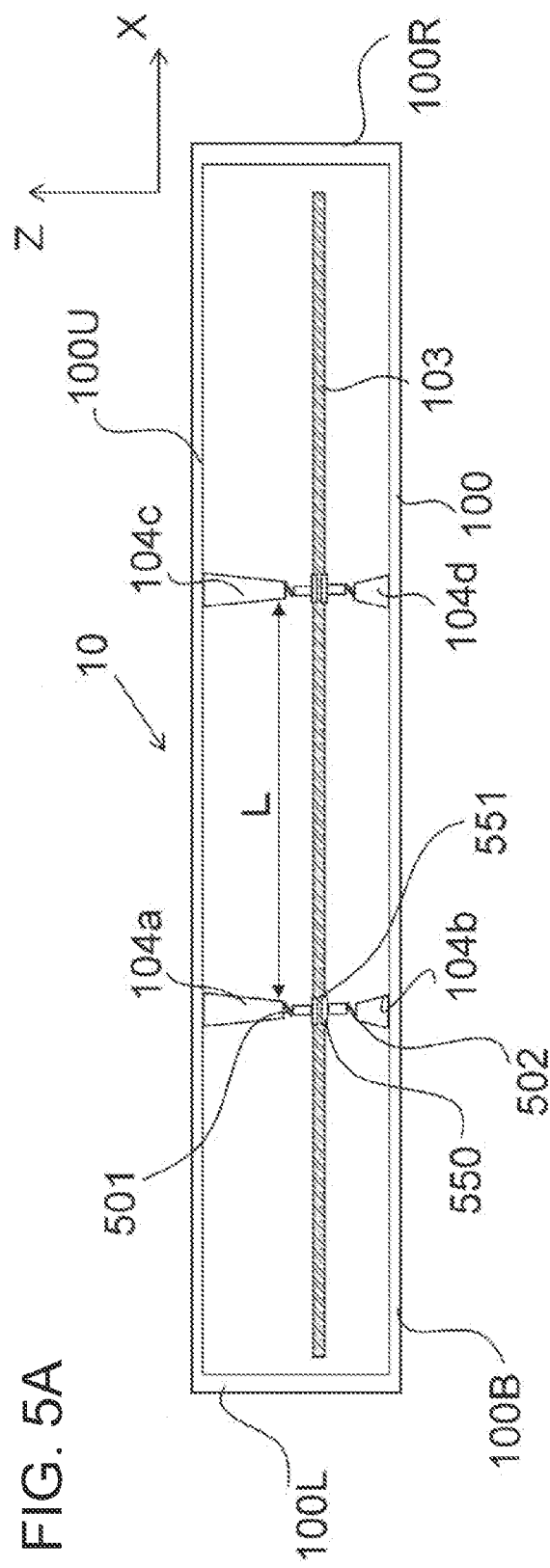
FIGS. 5A and 5B are sectional views of a stereo camera device according to a second embodiment.
Figure 5B:
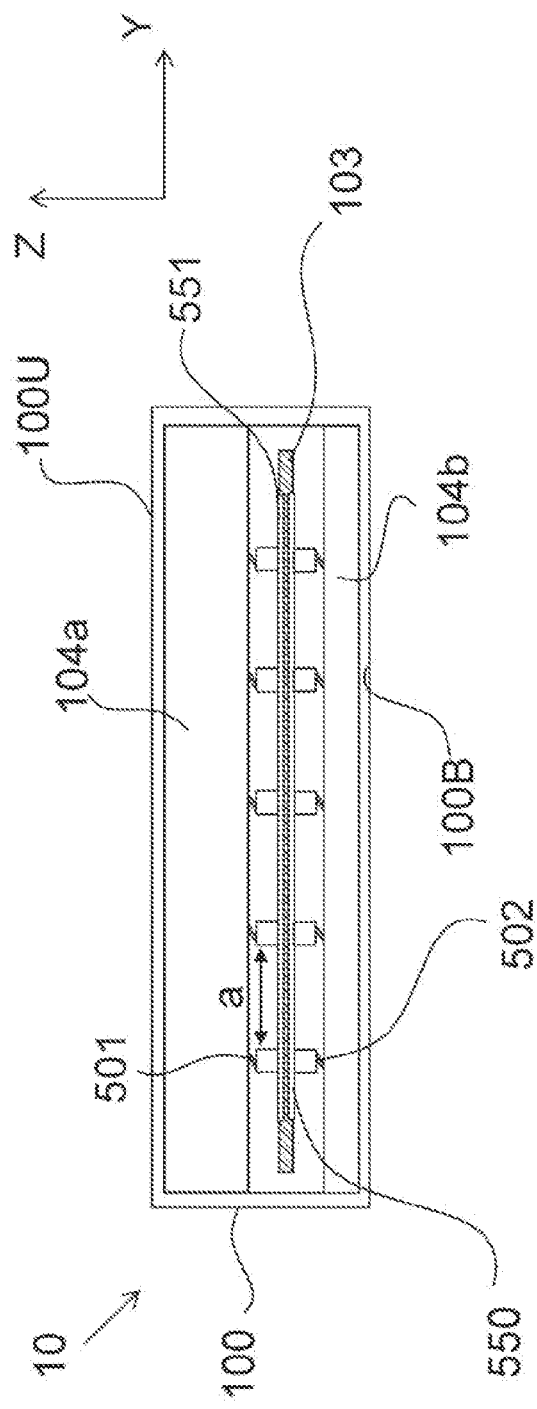

FIG. 5(a) and FIG. 5(b) are sectional views of a casing 100 of a stereo camera device 10 in the second embodiment. FIG. 5(a) is a sectional view in an xy-plane of the casing 100, and FIG. 5(b) is a sectional view in a yz-plane of the casing 100. While the following description is made centering on partition plates 104a and 104b, partition plates 104c and 104d also have the same configurations.

As shown in FIG. 5(a) and FIG. 5(b), a lower end (−side of z-axis) of each of the ground members 501 made of resilient material such as a spring is soldered to a ground pattern 550 such as a circuit GND pattern and a frame GND pattern provided on an upper surface of a substrate 103. An upper end (+side of z-axis) of the ground member 501 is connected to a lower end of a partition plate 104a. An upper end (aside of z-axis) of the ground member 502 made of resilient material such as a spring is soldered to a ground pattern 551 provided on a lower surface of the substrate 103. A lower end (−side of z-axis) of the ground member 502 is connected to an upper end of the partition plate 104b.

The ground members 501 of the partition plates 104a and the ground members 502 of the partition plate 104b are the same as the stereo camera device 10 of the first embodiment in that the ground member 501 and the ground member 502 are provided substantially on the same straight line in the z-axis direction, and in that the ground members 501 and the ground members 502 are provided at predetermined interval a in the y-axis direction. According to the stereo camera device 10 of the second embodiment having the above-described connecting manner also, the same function effects as the stereo camera device of the first embodiment can be obtained.

Third Embodiment

Figure 6:
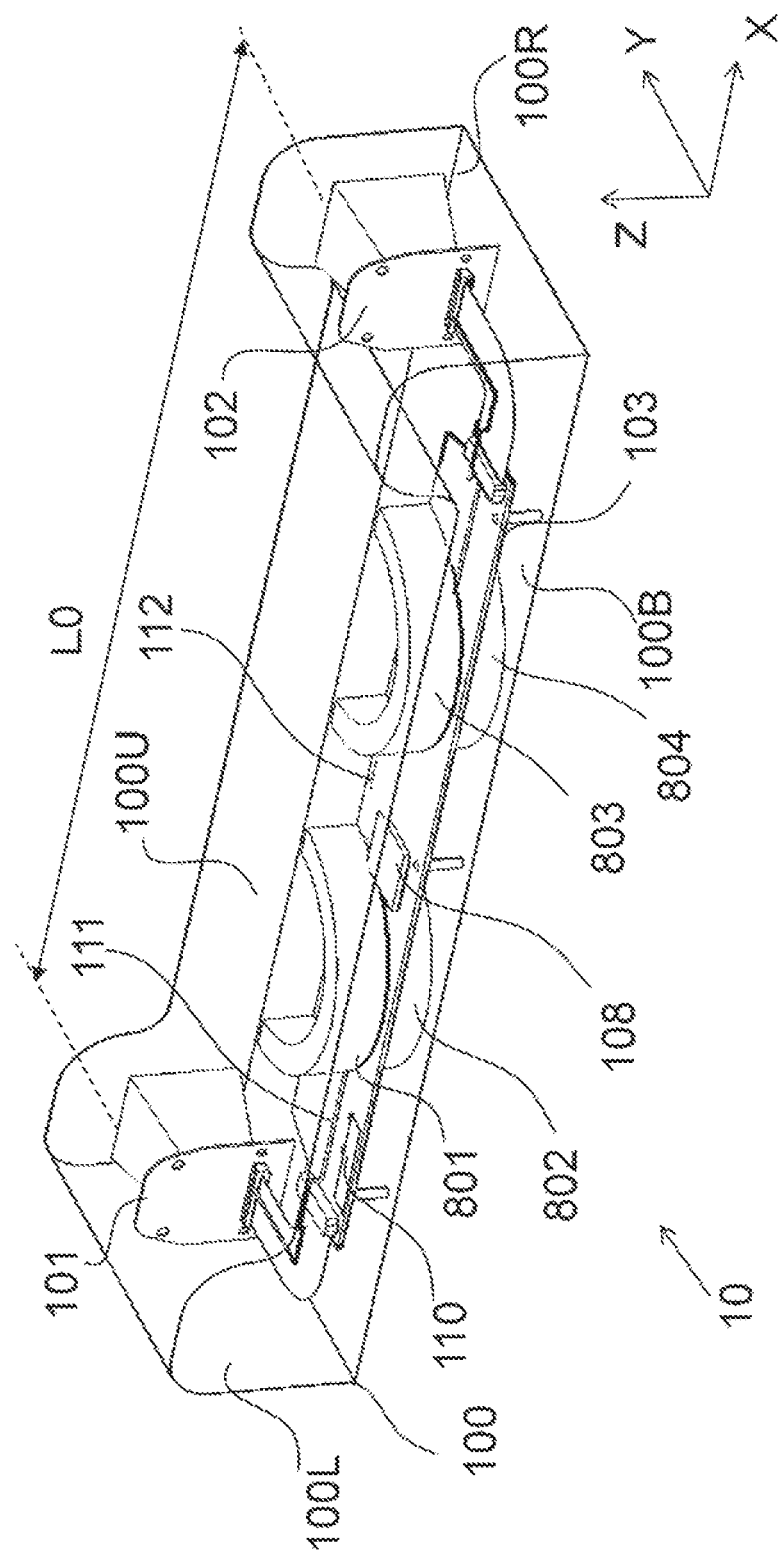
FIG. 6 is a perspective: view for describing an interior structure of a stereo camera device according to a third embodiment.

A third embodiment of the stereo camera device according to the present invention will be described with reference to a drawing. In the following description, the same reference signs are allocated to the same constituent elements as those of the first embodiment, and differences will mainly be described. Points which are not especially described are the same as the first embodiment. In the third embodiment, a shape of a partition plate is different from that of the partition plate of the first embodiment in which the partition plate is formed into a rectangular plane which is parallel to a yz-plane FIG. 6 is a perspective view for describing, in a transmissive manner, an interior structure of the stereo camera device 10 according to the third embodiment. As shown in FIG. 6, partition plates 801 to 804 are formed such that cross sections thereof are formed into arc shapes at planes which are parallel, to an xy-plane. Even when the partition pates 801 to 804 have the shapes shown in FIG. 6, an interior of the casing 100 is divided into a plurality of spaces by the partition plates 801 to 804 and a wall surface of the casing 100. In this embodiment, inner diameters of the arc-shaped partition plates 801 to 804 and distances of partition plates which are adjacent to each other in the x-axis direction are determined based on the above-described equation (2). As a result, in the spaces divided by the partition plates 801 to 804, noise generated by signal lines 111 and 112 becomes radiation noise having cavity resonance frequency f1 by the resonance phenomenon. The partition plates 801 to 804 and the substrate 103 are connected to each other in the same manner as the first embodiment or the second embodiment. According to the stereo camera device 10 of the third embodiment having the above-described connecting manner also, the same function effects as the stereo camera device of the first embodiment can be obtained.

Shapes of cross sections of the partition plates 801 to 804 which are parallel to the xy-plane are not limited to the arc shapes, and as the cross sections, various shapes such as triangular shapes and stair shapes are included. It is preferable that the cross section shape can avoid installation positions of the various ICs provided on the substrate 103.

The following modifications are also within the scope of the present invention, and one of the modifications may be used alone or a plurality of modifications may be combined with the above-described embodiments.

Figure 7:
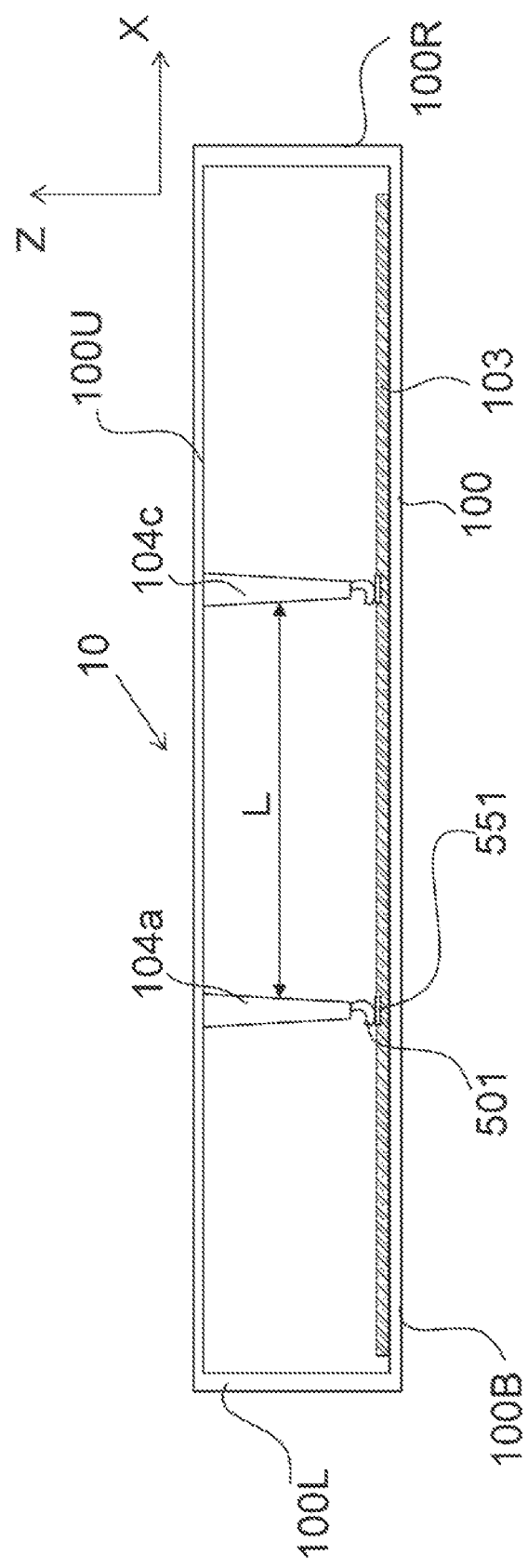
FIG. 7 is a sectional view of a stereo camera device according to a modification.

(1) Instead of the structure in which the partition plates 104 are provided on an inner will of the upper surface 100U of the casing 100 and an inner wall of the bottom surface 100B and the substrate 103 is sandwiched between the +side of z-axis and the –side of z-axis, it is also possible to employ a structure that the partition plates 104 are provided on one of the inner wall of the upper surface 100U of the casing 100 and die inner wall of the bottom surface 100B. For example, when a mounted product is not provided on the lower surface of the substrate 103, the substrate 103 may be fixed to the inner wall of the bottom surface 100B of the casing 100 through a screw of the like, and the lower end of the partition plates 104 provided on the inner wall of the upper surface 100U of the casing 100 and the upper surface of the substrate 103 may be connected to each other as shown in FIG. 7.

(2) Instead of the structure that the partition plate 104 and the ground patterns 550 and 551 provided on the substrate 103 are connected to each other through, the ground members 501 and 502, the partition plate and the ground patterns 550 and 551 of the substrate 103 may directly be connected to each other. In this case, it is preferable that the end of the partition plate on the side of the substrate 103 be processed into such a shape that a space of the predetermined interval a is formed.

(3) The stereo camera device 10 is not limited to the in-vehicle stereo camera provided in a vehicle, and the stereo camera device 10 may be used in a stereo camera provided in a moving body such as a construction machine and a railroad vehicle, and an industrial robot.

The present invention is not limited to the above-described embodiments unless the feature of the invention are not damaged, and other modes which are considered within a scope of technical idea of the invention is also included in the scope of the invention.

REFERENCE SIGNS LIST 10 stereo camera device
100 casing
101 first imaging portion
102 second imaging portion
103 substrate
104, 801, 802, 803, 804 partition plate
108 image processing IC
109 microcomputer
110 connector
111, 112 signal lines
501, 502 ground member
550, 551 ground pattern

The invention claimed is:

1. A stereo camera device, comprising:
a casing;
a first imaging portion provided on one of ends of the casing in a longitudinal direction of the stereo camera device,
a second imaging portion provided on the other end of the casing in the longitudinal direction;
a substrate on which a processing circuit connected to the first imaging portion and the second imaging portion through signal lines is mounted, on which a connector for outputting a signal processed by the processing unit to an external device is placed, and which is provided in the casing; and
at least one partition for dividing an interior of the casing into a plurality of spaces in the longitudinal direction at first intervals corresponding to a frequency band which suppresses radiation noise from the signal lines,
wherein the at least one partition includes a first partition member provided in an inner wall of an upper surface of the casing in a short direction of the stereo camera device, and a second partition member provided on an inner wall of a lower surface of the casing in the short direction,
wherein the first partition member is connected to a ground wire provided on an upper surface of the substrate through a first ground member,
wherein the second partition member is connected to a lower surface of the substrate through a ground wire provided on a second ground member, and
further comprising at least one more first ground member and one more second ground member, wherein a second interval between the pair of ground members is determined as a value corresponding to radiation noise from the signal line.

2. The stereo camera device according to claim 1, wherein the first and second ground members are resilient members which are respectively interposed between the ground wire of the upper surface of the substrate and the ground wire of the lower surface and the first and second partition members.

3. The stereo camera device according to claim 1, wherein the first interval is set as a distance which cavity-resonates the radiation noise and which brings frequency of the radiation noise into a frequency band higher than a noise frequency band prescribed by the external device.

4. The stereo camera device according to claim 1, wherein the second interval is set as a distance capable of cutting off radiation noise having frequency which is smaller than cavity resonance frequency that is determined by the first partition member and the second partition member provided at the first interval.

\* \* \* \* \*